US012748273B2

(12) United States Patent
Mack et al.

(10) Patent No.: US 12,748,273 B2
(45) Date of Patent: Sep. 29, 2026

(54) ENHANCED OPTICAL MODULE COOLING WITH ANGLED FINS

(71) Applicant: Ciena Corporation, Hanover, MD (US)

(72) Inventors: Bonnie Lynne Mack, Carp (CA); Georges Turcotte, Ottawa (CA); Victor Aldea, Ottawa (CA); Francois Pellerin, Ottawa (CA)

(73) Assignee: Ciena Corporation, Hanover, MD (US)

( * ) Notice: Subject to any disclaimer, the term of this patent is extended or adjusted under 35 U.S.C. 154(b) by 336 days.

(21) Appl. No.: 18/464,690

(22) Filed: Sep. 11, 2023

(65) Prior Publication Data

US 2025/0085495 A1 Mar. 13, 2025

(51) Int. Cl.
*H05K 7/20* (2006.01)
*G02B 6/42* (2006.01)

(52) U.S. Cl.
CPC ....... *G02B 6/4269* (2013.01); *H05K 7/20409* (2013.01)

(58) Field of Classification Search
CPC .......................... G02B 6/4269; H05K 7/20409
USPC .......................................................... 361/715
See application file for complete search history.

(56) References Cited

U.S. PATENT DOCUMENTS 6,893,293 B2 * 5/2005 Ice ...................... H05K 9/0058 439/607.2
6,935,882 B2 * 8/2005 Hanley ................ G02B 6/4292 439/372
7,048,452 B2 * 5/2006 Malagrino, Jr. ..... G02B 6/4261 385/92
7,131,859 B1 * 11/2006 Zumbrunnen ....... G02B 6/4246 439/577
7,178,996 B2 * 2/2007 Malagrino, Jr. ..... G02B 6/4284 361/752
7,371,965 B2 * 5/2008 Ice ...................... G02B 6/4269 174/548
8,081,470 B2 * 12/2011 Oki ..................... G02B 6/4201 165/185

(Continued)

FOREIGN PATENT DOCUMENTS

WO WO-2023045686 A1 * 3/2023 ........... H05K 7/2039

OTHER PUBLICATIONS

Z. Chen et al., "Nano-ITLA Based on Thermo-Optically Tuned Multi-Channel Interference Widely Tunable Laser," Journal of Lightwave Technology, vol. 41, No. 16, Aug. 15, 2023, pp. 5405-5411.

(Continued)

*Primary Examiner* — Anatoly Vortman
(74) *Attorney, Agent, or Firm* — Baratta Law PLLC; Lawrence A. Baratta, Jr.

(57) ABSTRACT

An optical module, such as a Quad Small Form Factor (QSFP) or variant thereof, or another type of module, includes a housing; an optical subassembly positioned within the housing at an angle relative to the housing; circuitry connected to the optical subassembly; and heat fins located on and in contact with the housing, wherein the heat fibers are positioned near the optical subassembly. The angling of the optical subassembly supports improved thermal performance, i.e., larger heat fin area at locations due to the angle, and eliminates any bend radius issues on fibers exiting the optical subassembly.

15 Claims, 6 Drawing Sheets

(56) References Cited

U.S. PATENT DOCUMENTS

| | | | | |
|---|---|---|---|---|
| 8,449,203 | B2 * | 5/2013 | Downs | G02B 6/4269 361/709 |
| 8,760,870 | B2 * | 6/2014 | Yamamoto | G02B 6/4201 361/728 |
| 8,911,244 | B2 * | 12/2014 | Elison | H05K 7/20409 439/137 |
| 9,295,178 | B1 | 3/2016 | Aldea et al. | |
| 9,564,027 | B2 | 2/2017 | Ao et al. | |
| 9,778,430 | B2 * | 10/2017 | DeMeritt | G02B 6/4284 |
| 9,846,287 | B2 | 12/2017 | Mack | |
| 10,062,993 | B1 | 8/2018 | Lutkiewicz et al. | |
| 10,306,806 | B2 * | 5/2019 | Hall, III | G02B 6/4261 |
| 10,509,180 | B2 | 12/2019 | Meunier et al. | |
| 10,554,040 | B2 | 2/2020 | Meng et al. | |
| 10,732,366 | B2 | 8/2020 | Turcotte | |
| 10,782,492 | B2 | 9/2020 | Meunier et al. | |
| 10,852,497 | B2 * | 12/2020 | Maniloff | G02B 6/4273 |
| 10,877,230 | B1 | 12/2020 | Graham et al. | |
| 10,935,742 | B2 * | 3/2021 | Maniloff | G02B 6/4273 |
| 10,939,536 | B1 | 3/2021 | O'Leary et al. | |
| 11,013,146 | B2 | 5/2021 | Saturley et al. | |
| 11,609,394 | B2 | 3/2023 | Turcotte et al. | |
| 11,644,628 | B1 | 5/2023 | Brisebois et al. | |
| 2002/0185269 | A1 * | 12/2002 | Sato | H01L 23/3677 257/722 |
| 2003/0161108 | A1 * | 8/2003 | Bright | G02B 6/4277 361/707 |
| 2003/0169983 | A1 * | 9/2003 | Branch | H05K 7/20418 257/E23.114 |
| 2003/0236019 | A1 * | 12/2003 | Hanley | G02B 6/4292 439/372 |
| 2004/0101257 | A1 * | 5/2004 | Kruger | G02B 6/3897 385/92 |
| 2005/0190540 | A1 * | 9/2005 | Shearman | H05K 7/1461 361/715 |
| 2005/0220425 | A1 * | 10/2005 | Kropp | G02B 6/4292 385/88 |
| 2006/0222301 | A1 * | 10/2006 | Oen | G02B 6/4269 385/88 |
| 2009/0296350 | A1 * | 12/2009 | Oki | G02B 6/4269 361/709 |
| 2009/0296351 | A1 * | 12/2009 | Oki | G02B 6/4246 361/709 |
| 2011/0317964 | A1 * | 12/2011 | Downs | G02B 6/4201 385/92 |
| 2015/0139662 | A1 * | 5/2015 | Keil | G02B 6/4292 398/139 |
| 2017/0351044 | A1 * | 12/2017 | Xu | G02B 6/4256 |
| 2020/0100379 | A1 | 3/2020 | O'Leary | |
| 2020/0233162 | A1 | 7/2020 | Yu | |
| 2020/0257067 | A1 * | 8/2020 | Meunier | G02B 6/4284 |
| 2020/0271877 | A1 | 8/2020 | Maniloff et al. | |
| 2021/0112683 | A1 | 4/2021 | Mohajer et al. | |
| 2021/0136951 | A1 | 5/2021 | Graham et al. | |
| 2021/0382252 | A1 | 12/2021 | Shearman et al. | |
| 2022/0019040 | A1 | 1/2022 | Lu et al. | |
| 2022/0196923 | A1 | 6/2022 | O'Leary et al. | |
| 2022/0352651 | A1 | 11/2022 | O'Leary et al. | |
| 2023/0039781 | A1 | 2/2023 | Mohajer et al. | |
| 2023/0082599 | A1 | 3/2023 | Aldea et al. | |
| 2023/0180419 | A1 | 6/2023 | O'Leary et al. | |
| 2023/0194808 | A1 * | 6/2023 | Hu | G02B 6/4204 385/33 |
| 2025/0085495 | A1 * | 3/2025 | Mack | G02B 6/4269 |

OTHER PUBLICATIONS

Dec. 2, 2024, International Search Report and Written Opinion for International Patent Application No. PCT/US2024/045774.

* cited by examiner

Flotherm Results – Cut Plane thru' Tx

Airflow

ENHANCED OPTICAL MODULE COOLING WITH ANGLED FINS

FIELD OF THE DISCLOSURE

The present disclosure relates generally to networking hardware, namely optical modules. More particularly, the present disclosure relates to systems and methods for enhanced optical module cooling with angled fins.

BACKGROUND OF THE DISCLOSURE

In networking, optical interfaces can be realized through optical modules (also referred to as modules, pluggable modules, pluggable transceivers, transceivers, plugs, pluggables, modems, and the like). Optical interfaces are a key component for connectivity between network elements, switches, routers, base stations, or simply any networked device. As described herein, the term "optical module" is used to cover any variant of an integrated device for providing an optical interface. The typical form-factor is a pluggable module, but other implementations are possible. To improve availability, reduce cost, support interoperability, etc., various vendors, consortiums, forums, etc. propagate specifications and standards for optical modules, e.g., so-called Multi-Source Agreements (MSAs). Example MSAs include, without limitation, Small Form-factor Pluggable (SFP), 10 Gigabit small Form-factor Pluggable (XFP), Quad SFP (QSFP) and variants thereof, Octal SFP (OSFP) and variants thereof, C Form-factor Pluggable (CFP) and variants thereof, Analog Coherent Optics (ACO), Digital Coherent Optics (DCO), Consortium for On-Board Optics (COBO), etc. Of course, optical modules can also be proprietary vendor implementations as well. Additionally, new MSAs and the like are continually emerging to address new services, applications, and advanced technology. The standards (e.g., MSAs) define the optical module's mechanical characteristics, management interfaces, electrical characteristics, optical characteristics, power consumption, and thermal requirements.

Additionally, the optical portion of an optical module can also be an integrated design, e.g., a Transmitter Optical Subassembly (TOSA), a Receiver Optical Subassembly (ROSA), and the like. As described herein, any device having a fiber exit therefrom is defined as an optical subassembly which is used in the optical module. Effort has been underway to similarly standardize the optical subassembly in MSAs as well, such as, e.g., Micro Integrable Tunable Laser Assembly (uITLA), Nano Micro Integrable Tunable Laser Assembly (nITLA), and the like. A typical optical module will include the optical subassembly, e.g., an nITLA, along with a Printed Circuit Board (PCB), circuitry, a host interface, etc., all contained in a housing.

BRIEF SUMMARY OF THE DISCLOSURE

The present disclosure relates to systems and methods for enhanced optical module cooling with angled fins. Two competing aspects continue to define optical module design and operation, namely (1) higher bandwidth, power consumption, etc., and (2) reduced size. Components such as an nITLA will typically have a fixed size, MSAs such as QSFP-Double Density (QSFP-DD) will typically have size specifications as well, including specifications for the nITLA, or more specifically for the fiber exit requirements and the like, and the challenge is how to fit everything into a compact size while maintaining compliance to mechanical, optical, and thermal requirements. To address these challenges, the present disclosure includes an optical subassembly (e.g., an nITLA) in an optical module housing at an angle. The angle supports a fiber exit from a ferrule associated with the optical subassembly that meets bend radius requirements, and more importantly, the angle allows an angled heatsink which provided thermal dissipation improvement due to increased surface area of fins.

In an embodiment, an optical module includes a housing; an optical subassembly positioned within the housing at an angle relative to the housing; circuitry connected to the optical subassembly; and heat fins that are one or more of (1) located on the housing positioned near the optical subassembly, and (2) in contact with the optical subassembly. A top of the heat fins can be flat relative to one another and in a same plane as one another, and wherein, due to the angle, the heat fins can have a different length extending downward to the housing near the optical subassembly, such that the different length is based on a location of a given heat fin and the angle. The heat fins located at or near a faceplate of the housing can have less cross-sectional area than the heat fins located at or near a middle portion of the housing, based on the angle relative to the housing.

The housing can include a large volume portion at or near a faceplate, and wherein the optical subassembly is within the large volume portion. The heat fins can be on the housing over the large volume portion. The heat fins can be straight fins where airflow is front-to-back relative to a faceplate on the housing. The heat fins can be pins fins where airflow is both (1) front-to-back relative to a faceplate on the housing, and (2) side-to-side relative to sides of the housing where the sides are adjacent to the faceplate. The optical subassembly can connect to a ferrule that supports an optical fiber, wherein the angle is based on a bend radius of the optical fiber.

The housing can include a faceplate, a nose portion adjacent to the faceplate, and a middle portion that extends to an end, configured to engage a host device, wherein the optical subassembly is located substantially in the nose portion. The middle portion can engage one or more of a riding heatsink and a cooling plate in a host device for cooling thereof, and wherein the heat fins have a smaller area than the riding heatsink or the cooling plate. The optical subassembly can be a Nano Integrable Tunable Laser Assembly (nITLA). The optical module can be a Quad Small Form Factor (QSFP) or variant thereof.

The optical module can be based on a first Multisource Agreement (MSA) and the optical subassembly can be based on a second MSA, each of the first MSA and the second MSA defining a plurality of characteristics of the optical module and the optical subassembly, respectively. The optical module can be a pluggable optical module configured to be inserted into a host device. The angle can be at least two degrees.

In another embodiment, a Quad Small Form Factor (QSFP) optical module includes a housing including a faceplate, a nose portion adjacent to the faceplate, and a middle portion adjacent to the nose portion; an optical subassembly positioned within the nose portion at an angle relative to the housing; circuitry connected to the optical subassembly; and heat fins that are one or more of (1) located on the nose portion positioned near the optical subassembly, and (2) in contact with the optical subassembly. A top of the heat fins can be flat relative to one another and in a same plane as one another, and wherein, due to the angle, the heat fins can have a different length extending downward to the housing near the optical subassembly, such that the different length is based on a location of a given heat fin and the angle. The QSFP module can be a QSFP Double Density (QSFP-DD) module, and the optical subassembly can be a Nano Integrable Tunable Laser Assembly (nITLA).

In a further embodiment, a method includes providing an optical module that includes a housing; an optical subassembly positioned within the housing at an angle relative to the housing; circuitry connected to the optical subassembly; and heat fins that are one or more of (1) located on the housing positioned near the optical subassembly, and (2) in contact with the optical subassembly. A top of the heat fins can be flat relative to one another and in a same plane as one another, and wherein, due to the angle, the heat fins can have a different length extending downward to the housing near the optical subassembly, such that the different length is based on a location of a given heat fin and the angle.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, the present disclosure relates to systems and methods for enhanced optical module cooling with angled fins. The foregoing description is presented with respect to a QSFP-DD optical module with an nITLA optical subassembly, such as for supporting an 800 Gb/s ZR interface (800GZR plug). This is presented for illustration purposes and to show the advantages of the various design techniques described herein. While these techniques are presented in context of the QSFP-DD with an nITLA for an 800GZR, those skilled in the art will appreciate they are not limited to these types of optical modules, optical subassemblies, and network applications. That is, the angling of the optical subassembly and the associated heat fins can be in any optical module to gain the benefit of the improved thermal cooling.

Figure 1:
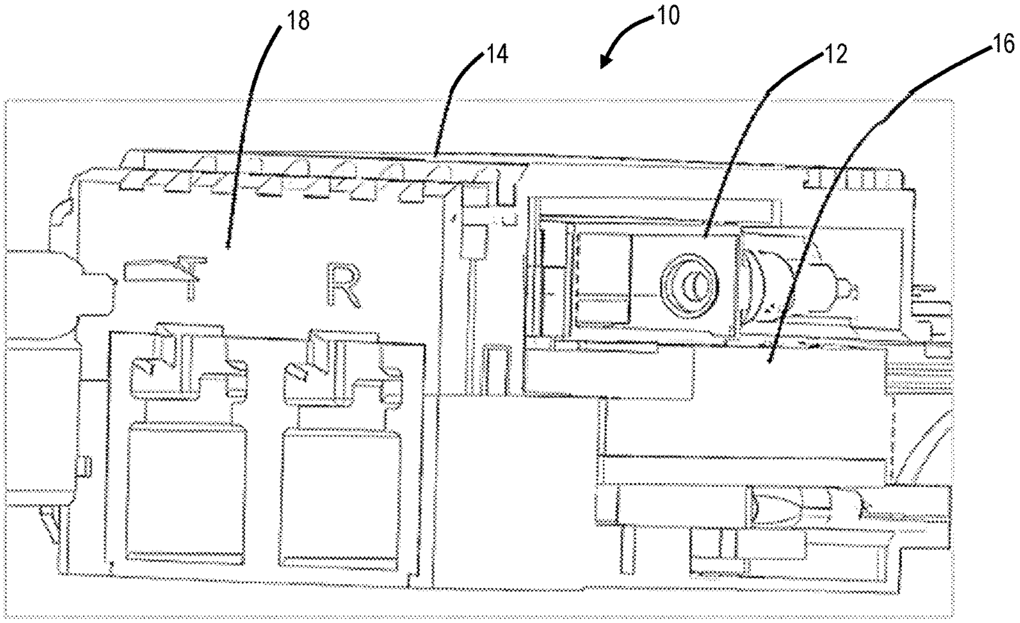
FIG. 1 (Prior Art)
FIG. 1 is a front perspective, cross-sectional view
Figure 2:
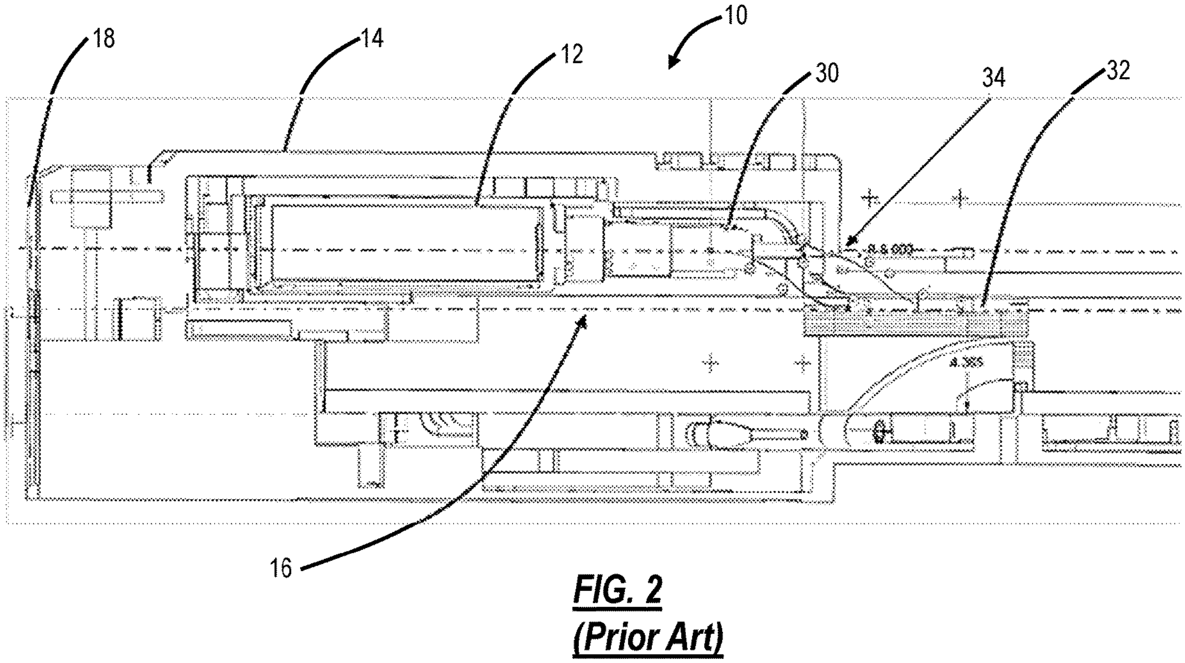
FIG. 2 (Prior Art)
FIG. 2 is a side, cross-sectional view of a QSFP-DD optical module with an nITLA optical subassembly therein, with the nITLA optical subassembly being substantially flat, relative to a housing of the QSFP-DD optical module.
Figure 3:
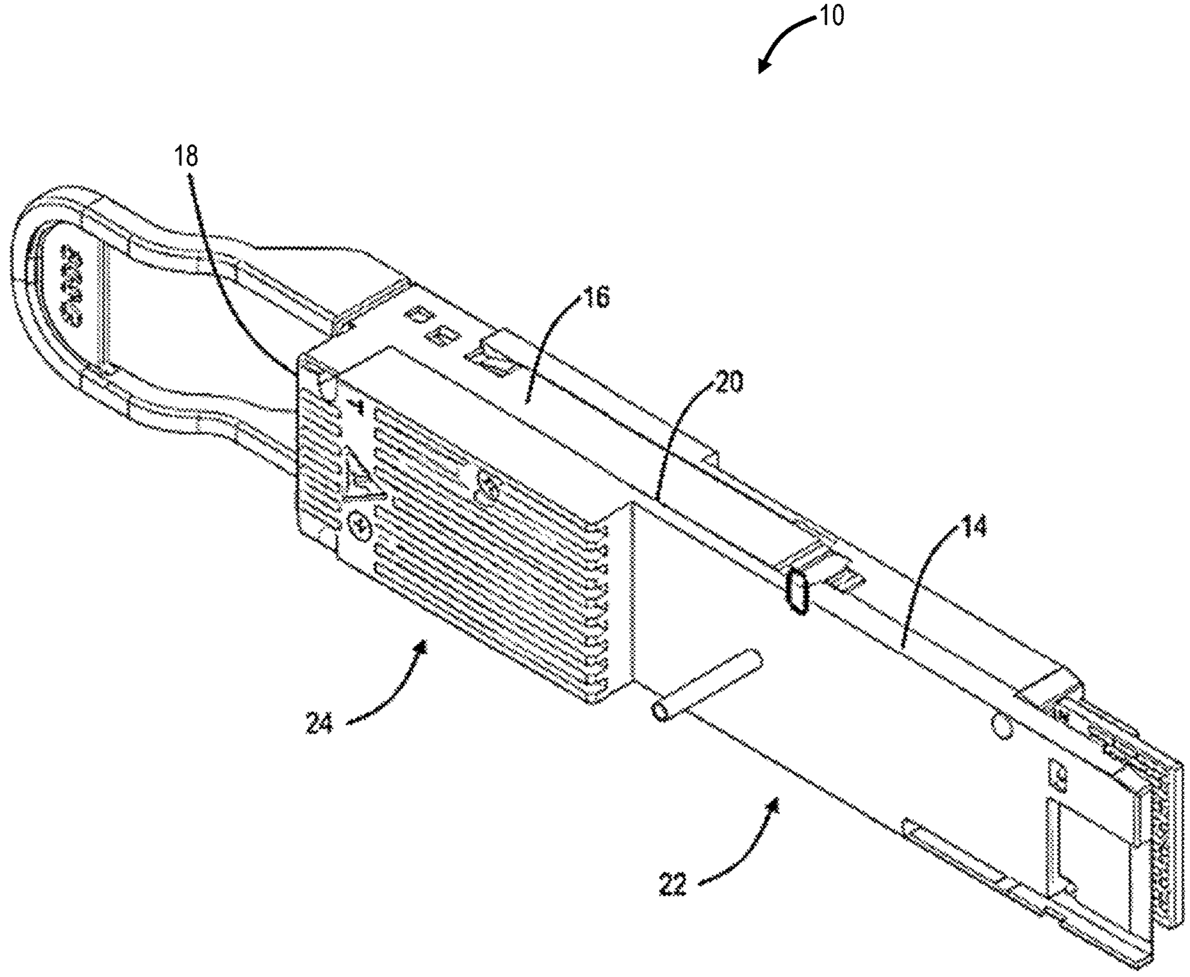
FIG. 3 is a perspective view of the QSFP-DD optical module, a housing, a large volume region, and a middle portion.

FIG. 1 is a front perspective, cross-sectional view and FIG. 2 is a side, cross-sectional view of a QSFP-DD optical module 10 with an nITLA optical subassembly 12 therein, with the nITLA optical subassembly 12 being substantially flat, relative to a housing 14 of the QSFP-DD optical module 10. By saying the nITLA optical subassembly 12 is substantially flat, this means there is substantially no angle of the nITLA optical subassembly 12 relative to the housing 14. The QSFP-DD optical module 10 has a large volume region 16 that extends in front of a faceplate 18 to a middle portion 20. FIG. 3 is a perspective view of the QSFP-DD optical module 10, the housing 14, the large volume region 16, and the middle portion 20. Also, QSFP-DD defines different types of plugs, referred to as Type 2A and Type 2B plugs. The Type 2B plug increases this front volume region 16 by increasing the allowable height of the nose of the housing 14 by 1.7 mm over the Type 2A plug. None of this front volume region 16 is in direct contact with a riding heatsink (not shown) designed to cool the QSFP-DD optical module 10. In FIG. 3, the riding heatsink (not shown) would be in contact with a region 22 of the housing 14.

This volume region 16 is used more and more for high power internal components but this means they are difficult to cool. The components in the front of the QSFP-DD optical module 10 rely on air flowing around the surface of the housing 14 or conduction through the housing 14 to the region 22 of the housing 14 in contact with the riding heatsink (not shown). The present disclosure can include short pin fins or straight fins 24 on the top surface of this volume region 16 (nose of the housing 14) to try to increase the surface area making it slightly more effective as a cooling surface.

In FIG. 2, the nITLA optical subassembly 12 includes a ferrule 30 which interfaces optical fiber between the nITLA optical subassembly 12 and circuitry 32 in the housing 14. The ferrule 30 is a ceramic, plastic or stainless steel part of a fiber-optic plug that holds the end of the fiber and precisely aligns it to a socket. Now, the objective is to include the nITLA optical subassembly 12 at a top portion of the volume region 16, as shown in FIG. 2. This led to a problem where a fiber 34 from the ferrule 30 having an unacceptable bend radius. Bending the fiber 34 excessively may cause the optical signal to refract and escape through the cladding. It could also cause permanent damage by creating micro cracks on the delicate glass fiber 34.

Based on the particular nITLA optical subassembly 12 and the ferrule 30, to address the bend radius issue, one option includes moving the nITLA optical subassembly 12 and the ferrule 30 lower within the large volume region 16. In this manner, the fiber 34 is less bent coming out of the ferrule as it is closer to the same plane as the circuitry 32. Of course, the disadvantage here is the waste of space in the large volume region 16. As the volume inside the housing 14 is extremely limited, every millimeter matters and wasting space to solve fiber bend radius issues is not an ideal solution.

A second option was to develop or use smaller nITLA optical subassemblies 12 and/or to customize the ferrule 30 to reduce its length. The idea here is if the nITLA optical subassembly 12 and/or the ferrule 30 can have a reduced length (in FIG. 2), the fiber 34 coming out of the ferrule 34 would have more length to connect to the circuitry 32, i.e., no sharp bend. The disadvantage here is cost, availability, customization, etc. Also, the nITLA optical subassembly 12 and/or the ferrule 30 are already designed to meet target specifications.

Figure 4:
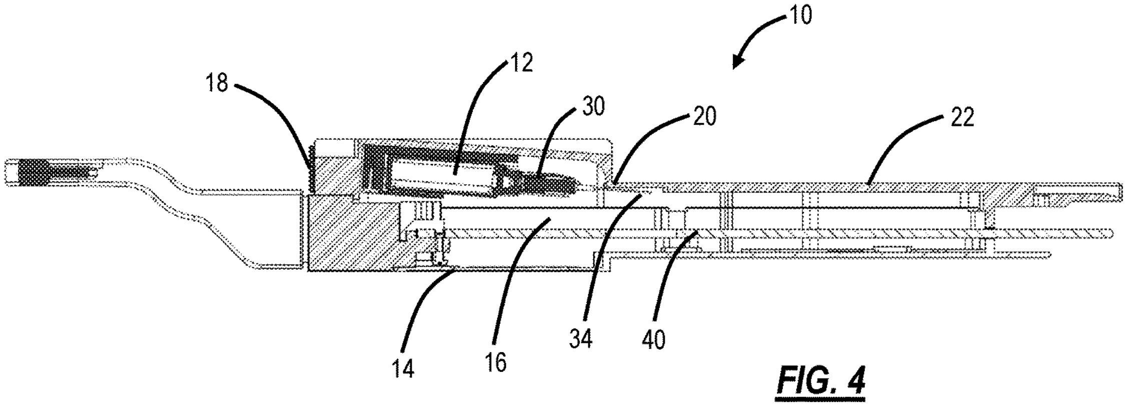
FIG. 4 is side, cross-sectional view of the QSFP-DD optical module with the nITLA optical subassembly therein, with the nITLA optical subassembly being angled, relative to a housing of the QSFP-DD optical module.
Figure 5:
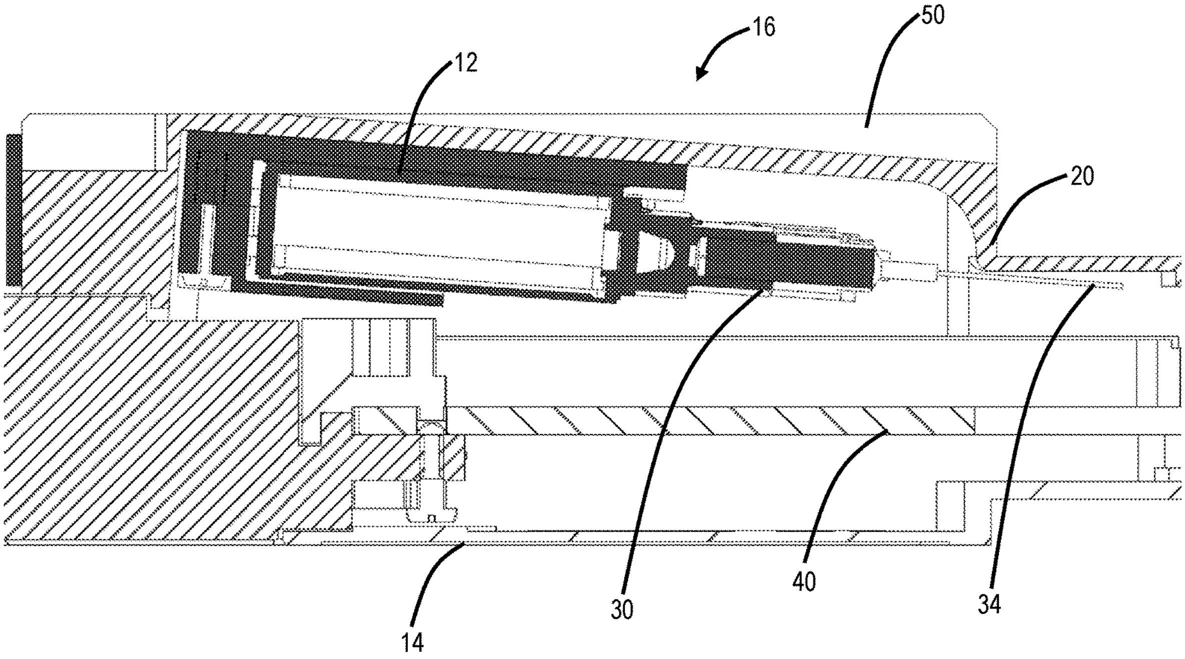
FIG. 5 is an exploded view from FIG. 4 of the large volume region of the QSFP-DD optical module.

To overcome the disadvantages of the two aforementioned options, the present disclosure includes the nITLA optical subassembly 12 located within the large volume region 16 at an angle, relative to the housing 14. FIG. 4 is side, cross-sectional view of the QSFP-DD optical module 10 with the nITLA optical subassembly 12 therein, with the nITLA optical subassembly 12 being angled, relative to a housing 14 of the QSFP-DD optical module 10. FIG. 5 is an exploded view from FIG. 4 of the large volume region 16.

The nITLA optical subassembly 12 is located in a top portion of the large volume region 16, avoiding the disadvantage of the first option, i.e., lowering the nITLA optical subassembly 12. To solve the bend radius issue, the nITLA optical subassembly 12 is located at an angle relative to the housing 14, such that the fiber 34 out of the ferrule 30 is not bent higher than a bend radius limit, avoiding the disadvantage of the second option. In particular, the large volume region 16 has a wall at the middle portion 20, and by angling the nITLA optical subassembly 12 and the ferrule 30, the fiber 34 does not need to bend unnecessarily. That is, by angling the optical subassembly 12, the fiber 34 is able to exit the QSFP-DD nose and connect to circuitry on a Printed Circuit Board (PCB) 40 in the housing 14 without violating any bend radius.

Accordingly, the angling of the optical subassembly 12 is advantageous with respect to the bend radius of the fiber 34. It was also determined this angling of the optical subassembly 12 has significant thermal improvement over the embodiment in FIGS. 1 and 2, where the optical subassembly 12 is substantially flat. Again, in this use case, the nITLA optical subassembly 12 is included in the large volume region 16, which can be referred to as the nose of the plug or the housing 14. Disadvantageously, this does not interact or make direct contact with a riding heatsink. Advantageously, this angling of the optical subassembly 12 allows angled fins 50 which have more surface area in the region with highest air speed, thereby supporting the thermal improvement over the embodiment in FIGS. 1 and 2.

FIGS. 6-9 are perspective diagrams of QSFP-DD optical modules 10A-10D for illustrating heat fins on a nose portion of the housing 14. The nose portion is the large volume region 16 where the nITLA optical subassembly 12 is included. Again, this nose portion typically does not contact a riding heat sink (not shown) that contacts a portion 22 of the housing 14. As such, there is a need to include heat fins on the nose portion. FIGS. 6-9 illustrate different approaches to heat fins 60-66 on the housing 14 over the large volume region 16.

Figure 6:
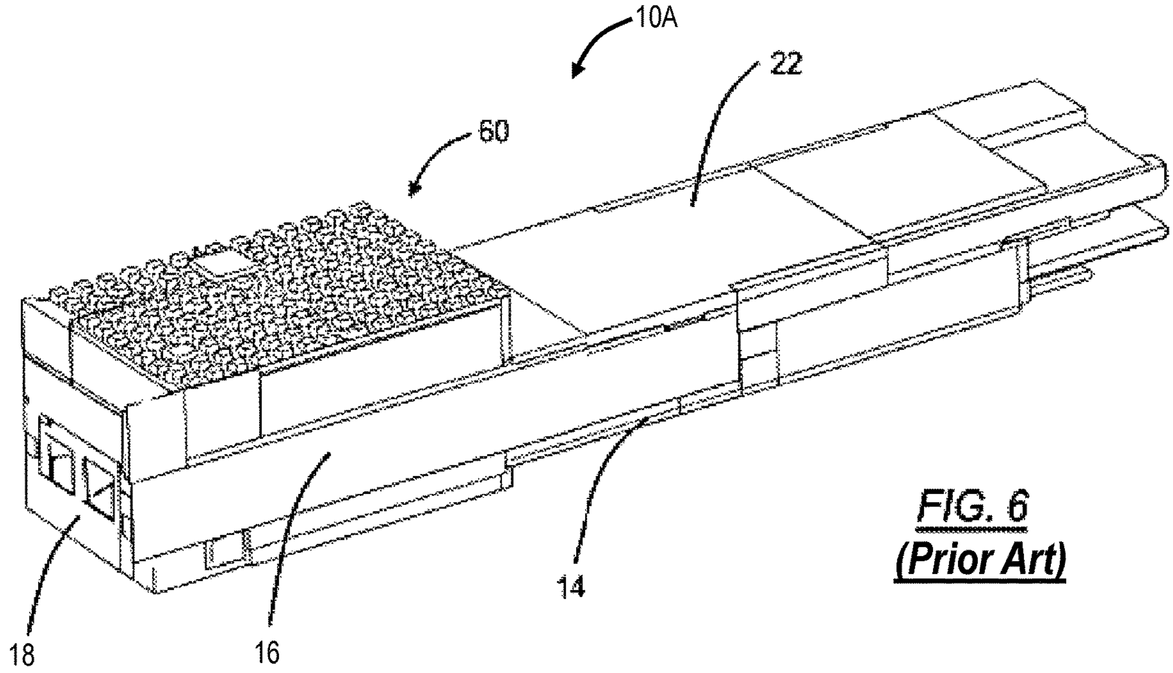
FIG. 6 (Prior Art)
FIGS. 6-9 are perspective diagrams of QSFP-DD optical modules for illustrating heat fins on a nose portion of the housing.
Figure 7:
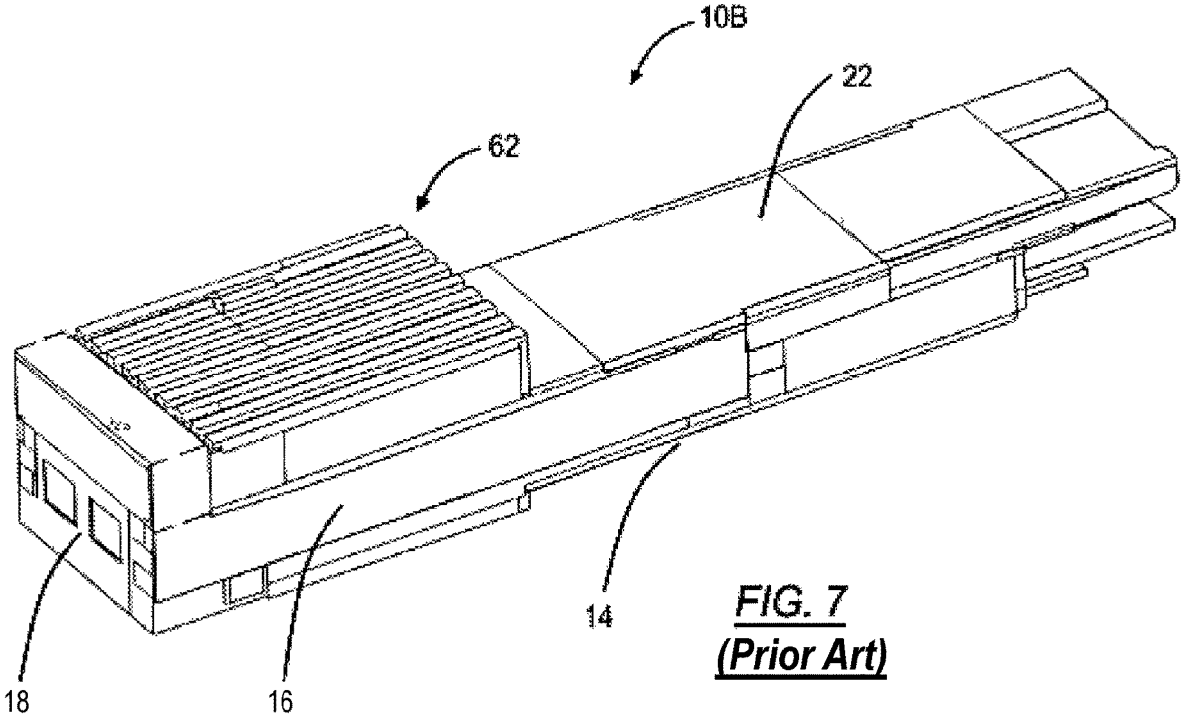
FIG. 7 (Prior Art)

FIGS. 6 and 7 illustrate two approaches with the nITLA optical subassembly 12 being flat inside the QSFP-DD optical modules 10A, 10B. FIG. 6 includes heat pin fins 60 on the housing 14 over the large volume region 16. The heat pin fins 60 are stakes that are arranged in a matrix, i.e., columns and rows. The heat pin fins 60 support airflow in two directions, namely front-to-back and side-to-side. In a typical networking environment, airflow is typically front-to-back, so the side-to-side airflow is not too beneficial. To that end, FIG. 7 includes straight heat fins 62 on the housing 14 over the large volume region 16. Here, the straight heat fins 62 run front-to-back, blocking the side-to-side airflow. Advantageously, the straight heat fins 62 provide more area to dissipate heat versus the heat pin fins 60. However, in both FIGS. 6 and 7, the heat pin fins 60 and the straight heat fins 62 are all about the same height which is not large. Those skilled in the art will understand that heat fins or pins dissipate heat based on their surface area.

With FIGS. 6 and 7, the heat pin fins 60 and the straight heat fins 62 can be referred to as a flat fins, when each individual fin is a same size (i.e., height, length, overall surface area). While these do support some thermal dissipation, there is still higher operating temperatures and therefore higher operating power of the nITLA optical subassembly 12, relative to the angled approach in the present disclosure.

Figure 8:
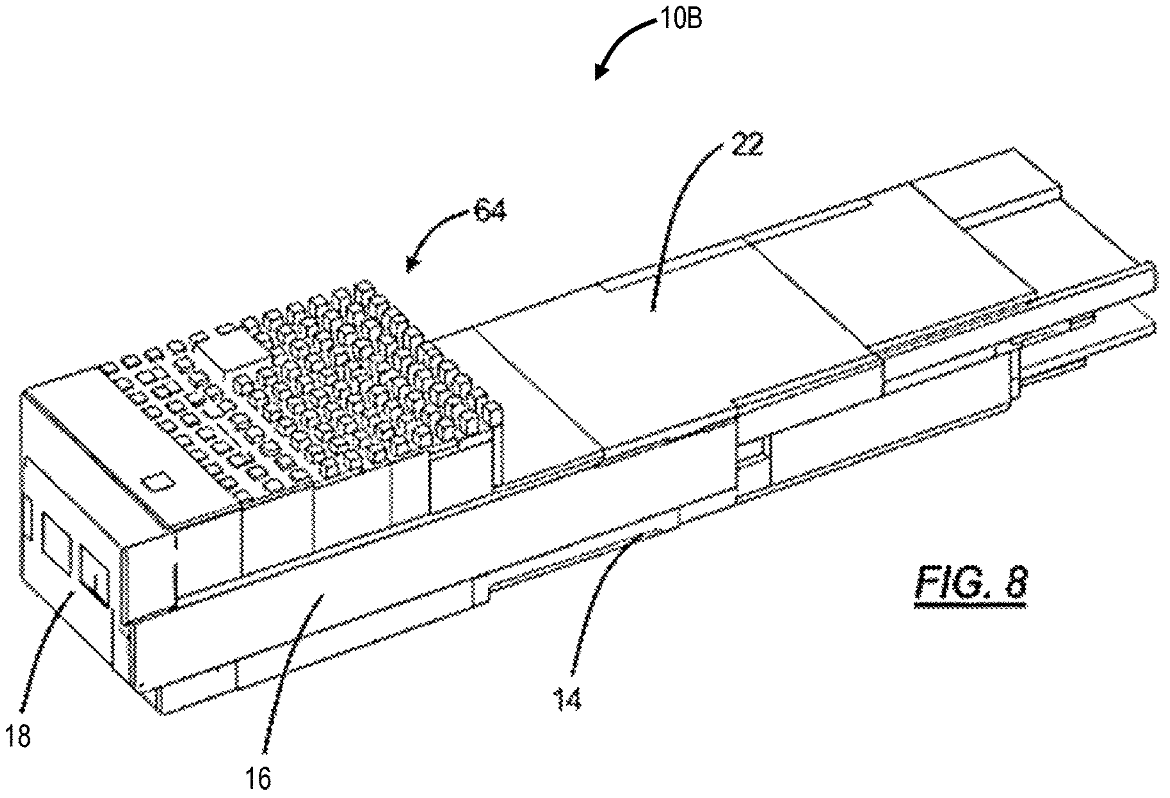
Figure 9:
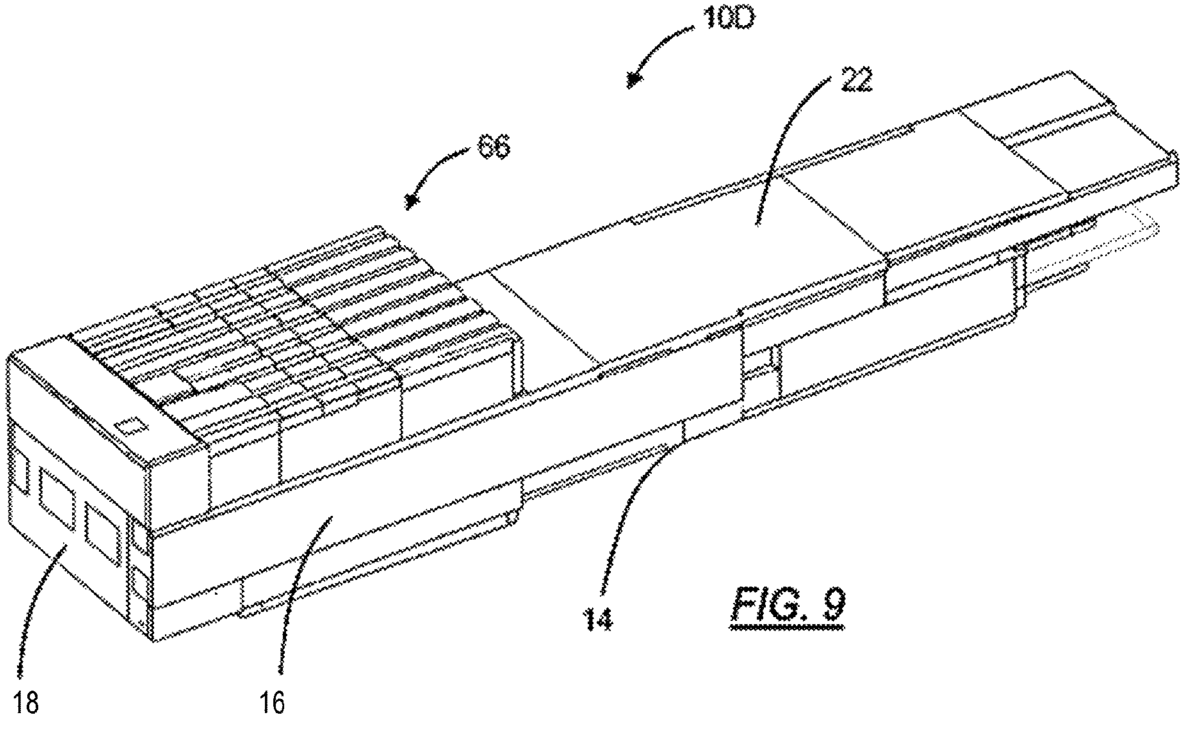

FIGS. 8 and 9 both utilize the nITLA optical subassembly 12 at an angle relative to the housing 14, as illustrated in FIGS. 4 and 5. As a result, fins 50 over the top surface of the housing 14 are no longer all the same length but were very short at the front of the large volume region 16 and longer towards the middle portion 20, resulting in angled fins over the nose of the housing 14. The angled fins improve the cooling of the nITLA optical subassembly 12.

FIG. 8 includes heat pin fins 64 on the housing 14 over the large volume region 16. Of note, the height (or surface area) of the heat pin fins 64 are larger as they extend from the faceplate 18. FIG. 9 includes straight heat fins 66 on the housing 14 over the large volume region 16. Again, the height (or surface area) of the straight heat fins 66 are larger as they extend from the faceplate 18. So, while this concept allows the use of a non-customized component (nITLA) which has a long ferrule for the fiber 34, it also maximizes the use of the volume in the nose of the plug and improves the cooling of the nITLA in the nose of the plug as the angled fins result in less flow blockage over the nose just in front of the faceplate.

Figure 10:
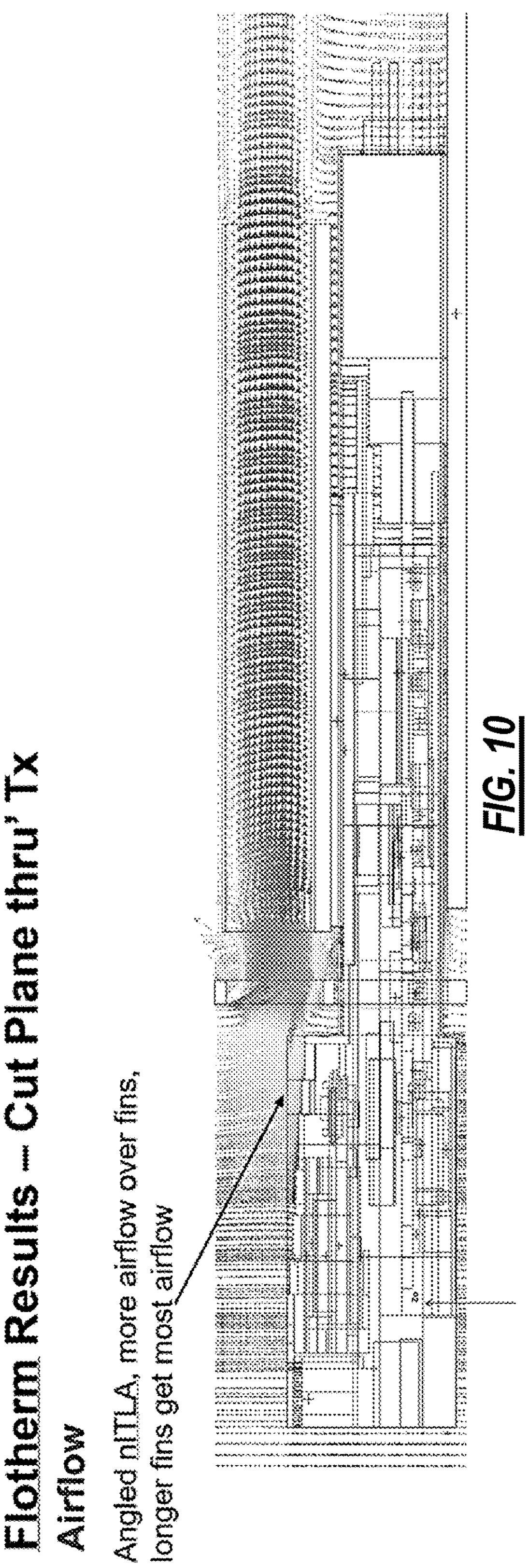
FIG. 10 (Prior Art)
FIGS. 10 and 11 are side, cross-sectional views illustrating airflow where FIG. 10 includes the angled fins and FIG. 11 includes the flat fins.
Figure 11:
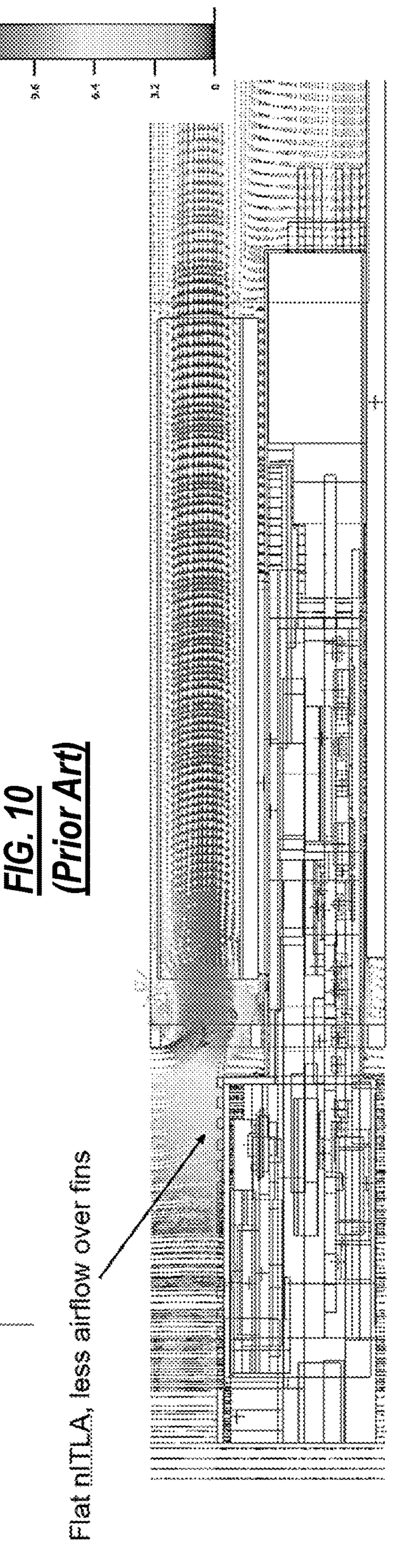

FIGS. 10 and 11 are side, cross-sectional views illustrating airflow where FIG. 10 includes the angled fins and FIG. 11 includes the flat fins. These diagrams illustrate a Flotherm simulation (which is a Computational Fluid Dynamics (CFD) simulation) showing the angled fins in FIG. 10 enable more airflow over the fins, thereby having better thermal performance than the flat fins in FIG. 11.

Also, an assessment was done to evaluate the thermal penalty of using the non-customized component. As it turned out, it was better thermally to use the standard component at an angle. The component temperature in FIG. 9 is about 3° C. cooler than FIG. 6 and about 2° C. cooler than FIG. 7. The angled fins result in less flow blockage in front of the faceplate. The angled fins puts the larger fin surface area in the region with highest air speed.

The nITLA optical subassembly 12 contains a thermoelectric cooler (TEC) which uses the least amount of power closest to a set operating point which is usually set based on the best performance of the laser it is cooling. As the nose of the plug increases in temperature above the optimal laser operating point, the TEC uses more power. Anything that helps to reduce the temperature of the nose of the plug will also reduce the power draw of the nITLA resulting in lower power of the optical plug. The nose of the plug also has the potential to be touched by a technician so keeping the nose of the plug cooler reduces the risk of exceeding the touch temperature limit of the plug.

Those skilled in the art will recognize there can be various values for the angle of the nITLA optical subassembly 12 and/or the ferrule 30. The value of the angle can be between two and ten degrees. In an embodiment, the angle is about four degrees. Those skilled in the art will recognize there can be different values with larger values increasing the fin size, but taking more volume in the large volume region 16. That is, the larger angle, the more area is wasted in the large volume region 16. For this reason, a smaller value of the angle is preferred, e.g., 15 degrees or less. Even having an angle in the single digits is valuable, e.g., two degrees to ten degrees, as this increase the fin height and relaxes the fiber bend. Accordingly, the present disclosure contemplates any value for the angle greater than 1 degree.

In an embodiment, an optical module 10 includes a housing 14; an optical subassembly 12 positioned within the housing 14 at an angle relative to the housing 14; circuitry 32 connected to the optical subassembly 12; and heat fins 50, 64, 66 that are one or more of (1) located on the housing 14 positioned near the optical subassembly 12, and (2) in contact with the optical subassembly 12. A top of the heat fins 50, 64, 66 is flat relative to one another and in a same plane as one another, and wherein, due to the angle, the heat fins 50, 64, 66 have a different length extending downward to the housing 14 near the optical subassembly 12, such that the different length is based on a location of a given heat fin 50 and the angle.

The heat fins 50 located at or near a faceplate 18 of the housing 14 can have less cross-sectional area than the heat fins 50 located at or near a middle portion 22 of the housing 14, based on the angle relative to the housing 14.

The housing 14 can include a large volume portion 16 at or near a faceplate 18, and wherein the optical subassembly 12 is within the large volume portion 16. The heat fins 50, 64, 66 can be on the housing 14 over the large volume portion 16. In an embodiment, the heat fins 50, 66 can be straight fins where airflow is front-to-back relative to a faceplate 18 on the housing 14. In another embodiment, the heat fins 50, 66 can be pins fins where airflow is both (1) front-to-back relative to a faceplate 18 on the housing 14, and (2) side-to-side relative to sides of the housing 14 where the sides are adjacent to the faceplate 18.

The optical subassembly 12 can connect to a ferrule 30 that supports an optical fiber 34, wherein the angle is based on a bend radius of the optical fiber 34. The housing 14 can include a faceplate 18, a nose portion (which can be referred to as a large volume region 16) adjacent to the faceplate 18, and a middle portion 22 that extends to an end, configured to engage a host device, wherein the optical subassembly 12 is located substantially in the nose portion. The middle portion 22 can engage a riding heatsink, a coldplate, or the like in the host device for cooling thereof, and wherein the heat fins 50, 64, 66 have a smaller area than the riding heatsink, the coldplate, etc.

The optical subassembly 12 can be some variant of an Integrable Tunable Laser Assembly (ITLA). The optical subassembly 12 can also be a Nano Integrable Tunable Laser Assembly (nITLA). Of course, other implementations are contemplated, such as a pico ITLA and the like. The optical module 10 can be a Quad Small Form Factor (QSFP) or variant thereof. The optical module 10 can be based on a first Multisource Agreement (MSA) and the optical subassembly 12 can be based on a second MSA, each of the first MSA and the second MSA defining a plurality of characteristics of the optical module 10 and the optical subassembly 12, respectively, as well as integration therebetween. As described herein, the term MSA means any pre-defined standard or specification for the plurality of characteristics of the optical module 10 and the optical subassembly 12, the characteristics being anything such as mechanical characteristics, management interfaces, electrical characteristics, optical characteristics, power consumption, thermal requirements, housing design, etc. The optical module 10 can be a pluggable optical module configured to be inserted into a host device.

In another embodiment, a Quad Small Form Factor (QSFP) optical module 10 includes a housing 14 including a faceplate 18, a nose portion 16 adjacent to the faceplate 18, and a middle portion 22 adjacent to the nose portion 16; an optical subassembly 12 positioned within the nose portion 16 at an angle relative to the housing 14; circuitry 32 connected to the optical subassembly 12; and heat fins 50, 64, 66 that are one or more of (1) located on the nose portion 16 positioned near the optical subassembly 12, and (2) in contact with the optical subassembly 12. A top of the heat fins 50, 64, 66 is flat relative to one another and in a same plane as one another, and wherein, due to the angle, the heat fins 50, 64, 66 have a different length extending downward to the housing 14 near the optical subassembly 12, such that the different length is based on a location of a given heat fin 50 and the angle. In an embodiment, the QSFP module can be a QSFP Double Density (QSFP-DD) module; although other variants of QSFP and other types of modules are also contemplated.

In a further embodiment, a method includes providing the optical module 10, such as for use in a host device, e.g., a network element, switch, router, computing platform, or any type of equipment requiring optical connectivity therefrom.

CONCLUSION

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Further, the various elements, operations, steps, methods, processes, algorithms, functions, techniques, modules, circuits, etc. described herein contemplate use in any and all combinations with one another, including individually as well as combinations of less than all of the various elements, operations, steps, methods, processes, algorithms, functions, techniques, modules, circuits, etc.

What is claimed is:

1. An optical module comprising:

a housing of the optical module, the housing enclosing internal components of the optical module and being configured to be inserted as a unit into a host device;

an optical subassembly positioned within the housing and within a nose portion of the housing at an acute angle relative to a plane of a printed circuit board disposed within the housing;

the printed circuit board comprising circuitry connected to the optical subassembly; and heat fins disposed on an exterior surface of the nose portion of the housing over the optical subassembly, wherein the heat fins have respective heights that increase with distance from a faceplate of the housing toward a middle portion of the housing such that tips of the heat fins define a generally common plane.

2. The optical module of claim 1, wherein a top of the heat fins is flat relative to one another and in a same plane as one another, and wherein, due to the angle, the heat fins have a different length extending downward to the housing near the optical subassembly, such that the different length is based on a location of a given heat fin and the angle, wherein the different length is based on the location of the given heat fin along the nose portion and the acute angle relative to the plane of the printed circuit board.

3. The optical module of claim 1, wherein the heat fins located near a faceplate of the housing have less cross-sectional area than the heat fins located near a middle portion of the housing, wherein the heat fins located nearer the faceplate have the less cross-sectional area than the heat fins located nearer an interface between the nose portion and the middle portion.

4. The optical module of claim 1, wherein the housing includes a large volume portion near the faceplate, and wherein the optical subassembly is disposed within the large volume portion, wherein the large volume portion comprises a large-volume region of the nose portion having an internal height greater than an internal height of the middle portion.

5. The optical module of claim 4, wherein the heat fins are disposed on a top exterior surface of the housing over the large-volume region.

6. The optical module of claim 1, wherein the heat fins are straight fins where airflow is directed along the straight fins in a direction parallel to an insertion direction of the optical module into the host device, from a faceplate side toward a rear side opposite the faceplate.

7. The optical module of claim 1, wherein the optical subassembly connects to a ferrule that supports an optical fiber, wherein the angle is based on a bend radius of the optical fiber, and wherein the acute angle is selected such that the optical fiber exits the nose portion and connects to the circuitry without violating the bend-radius requirement.

8. The optical module of claim 1, wherein the optical subassembly is a Nano Integrable Tunable Laser Assembly (nITLA).

9. The optical module of claim 1, wherein the optical module is a Quad Small Form Factor (QSFP) or variant thereof.

10. The optical module of claim 1, wherein the optical module is based on a first Multisource Agreement (MSA) and the optical subassembly is a QSFP Double Density (QSFP-DD) Type 2B plug in which an allowable height of the nose portion is increased relative to a QSFP-DD Type 2A plug.

11. The optical module of claim 1, wherein the optical module is a pluggable optical module configured to be inserted into a host device.

12. The optical module of claim 1, wherein the angle is at least two degrees and at most ten degrees.

13. An optical module comprising:

a housing including a faceplate, a nose portion adjacent to the faceplate, and a middle portion adjacent to the nose portion, wherein the optical module is configured in a Quad Small Form Factor (QSFP) family form factor, and wherein the housing is a housing of the optical module, encloses internal components of the optical module, and is configured to be inserted as a unit into a host device;

an optical subassembly positioned within the housing and within the nose portion at an acute angle relative to a plane of a printed circuit board disposed within the housing;

the printed circuit board comprising circuitry connected to the optical subassembly; and heat fins disposed on an exterior surface of the nose portion of the housing over the optical subassembly, wherein the heat fins have respective heights that increase with distance from the faceplate toward the middle portion such that tips of the heat fins define a generally common plane.

14. The optical module of claim 13, wherein a top of the heat fins is flat relative to one another and in a same plane as one another, and wherein, due to the angle, the heat fins have a different length extending downward to the housing near the optical subassembly, such that the different length is based on a location of a given heat fin and the angle, wherein the different length is based on the location of the given heat fin along the nose portion and the acute angle relative to the plane of the printed circuit board.

15. The optical module of claim 13, wherein one or more of the QSFP module is a QSFP Double Density (QSFP-DD) module, and the optical subassembly is a Nano Integrable Tunable Laser Assembly (nITLA).

* * * * *